United States Patent [19]

Schneider et al.

[11] Patent Number: 4,514,822
[45] Date of Patent: Apr. 30, 1985

[54] DEVICE FOR DATA ACQUISITION

[75] Inventors: Lutz Schneider, Malsch-Völkersbach; Bruno Guigas, Bruchsal, both of Fed. Rep. of Germany

[73] Assignee: Bruker Analytische Messtechnik GmbH, Rheinstetten-Forchheim, Fed. Rep. of Germany

[21] Appl. No.: 315,406

[22] Filed: Oct. 27, 1981

[30] Foreign Application Priority Data

Nov. 3, 1980 [DE] Fed. Rep. of Germany ....... 3041219

[51] Int. Cl.³ ...................... G06F 15/42; G06F 13/00
[52] U.S. Cl. ..................................... 364/900; 364/498
[58] Field of Search ............... 364/551, 498, 414, 200, 364/900

[56] References Cited

U.S. PATENT DOCUMENTS 4,017,839  4/1977  Calle et al. ........................ 364/200
4,140,394  2/1979  Roos .............................. 364/498 X

OTHER PUBLICATIONS

Koenig, "Computerized Infrared Spectroscopy", *Amer. Lab.*, vol. 6, No. 9 (Sep. 1974), pp. 9–16.
Intel, "8237/8237-Z High Performance Programmable DMA Controller", *MCS-80/85 Family User's Manual*, Oct. 1979, pp. 6-101–6-114.
Intel, "8257/8257-5 Programmable DMA Controller", *The 8080/8085 Microprocessor Book*, 1980, pp. 207–215.
Intel, "8271 Programmable Floppy Disk Controller", *The 8080/8085 Microprocessor Book*, 1980 pp. 232–250.
Intel Component Data Catalogue 1979, pp. 9-92 to 9-108, entitled Programmable DMA Controller.
Varian 620/L Computer Handbook, May 1971, pp. 12-8 to 12-18, entitled Buffer Interlace Controller (BIC).

*Primary Examiner*—Gareth D. Shaw
*Assistant Examiner*—Ronni S. Malamud
*Attorney, Agent, or Firm*—Burmeister, York, Palmatier, Hamby & Jones

[57] ABSTRACT

A device for digital acquisition, storage and processing of time-dependent data signals, especially for the accumulation of interferograms delivered by spin resonance and infrared spectrometers, comprises an A/D converter; a main memory having random access; a disk storage; a data channel connecting the A/D converter with the main memory which data channel contains a pointer register and a word counter and carries out the direct transfer of words delivered by the A/D converter to that area of the main memory indicated by the contents of the pointer register, the number of words being defined by the contents of the word counter; and a central unit which loads the pointer register and the word counter at the beginning of each measurement period and activates the transfer of word blocks from the main memory to the disk storage and vice versa. In such a device, a significant reduction of the processing time required by the transition from one word block to the following word block is achieved by providing the data channel 3 with an addressing register 15 assigned to the pointer register 14 with a block length register 17 assigned to the word counter 16 and with a block counter 18, the address register, the block length register and the block counter 18 being loaded at the beginning of a measurement procedure from the central unit 7, whereas the pointer register 14 and the word counter16 are always loaded before starting the accumulation of each word block by transferring the data from the address or block length register 15, 17, until the number of word blocks determined by the contents of the block counter has been accumulated.

4 Claims, 2 Drawing Figures

DEVICE FOR DATA ACQUISITION

The invention concerns a device for digital acquisition, storage and processing of rapidly incoming sequential data signals, especially for the accumulation of interferograms delivered by spectrometers for Nuclear Magnetic Resonance, Electron Resonance and Infrared Spectroscopy, with an Analog/Digital converter (abbreviated below as A/D converter), a main memory with random access, a disk storage, a data channel connecting the A/D converter with the main memory and containing a pointer register and a word counter and effecting the direct transfer of a number of words delivered by the A/D converter and defined by the contents of the word counter to the areas of the main memory indicated by the contents of the pointer register, a central unit effecting the loading of the pointer register and of the word counter at the beginning of the measuring periods, as well as the transfer of word blocks from the main memory to the disk storage and vice versa.

BACKGROUND OF THE INVENTION

In the case of Nuclear and Electron Spin Resonance Spectroscopy, a high frequency signal is obtained as a result of the excitation of the sample which is to be analyzed. This is an interference signal formed by the sum of various oscillations of different frequency and amplitude. The frequencies and amplitudes of the individual components of the interference signal, also called interferogram, can be obtained by executing a Fourier-analysis. This Fourier-analysis can be performed by digital data processing provided that the interferogram is stored as a sequence of digital words, whch specify the amplitude of the interferogram at discrete time intervals. The time interval between amplitude values determines the highest frequency which can be measured. The analysis of very weak signals may require many repetitions of the measuring procedure with the addition of the signals obtained. In this way, even those signals can be recognized which are normally below the noise level. This, however, requires an absolutely phase-coherent addition of the amplitude values obtained during successive measurements. The data quantities resulting from such measurements are too large to allocate them to a main memory with random access. It is possible, for example, that there are 128 K words (K = 1024) with 24 bits each during such a measurement.

Due to the large amount of data to be processed, there are known devices on the market for digital accumulation, storage and processing of data signals in connection with spin resonance and infrared spectrometers, which devices utilize, in addition to the main memory with random access, a disk storage system for accumulating the main part of the data. After the main memory has accumulated a certain number of data words delivered by the A/D converter, these words are transferred to the disk storage as a word block. The main memory offers place for two such word blocks and thus enables, on the one hand, the continuous input of words into one of these blocks and, on the other hand, the transfer of words from the second block to the disk storage. Furthermore, it is possible to back-transfer words resulting from a preceding measurement from disk into the main memory in order to to perform a summation of such back-transferred words with corresponding words created during another measurement.

The transfer of words from the A/D converter to the main memory is performed by a data channel containing a pointer register and a word counter. At the beginning of a measuring procedure, the pointer register is loaded with the address in the main memory where the first word of a word block must be stored. The word counter is loaded with the number of words contained in a word block. The appropriate register values are loaded by the central unit. After the measuring procedure is started, the data acquisition and data transfer to the main memory are performed independently of the central unit, such that the A/D converter processes the incoming signal at specified time intervals to give digital words which are transferred to the main memory via an addressing matrix and placed into the addresses determined by the pointer register. During every word transfer the contents of the pointer register and the word counter are modified until the desired number of words defined by the initial contents of the word counter have been transferred. At this point, the word counter informs the central unit that the word block is complete. Now, the central unit determines whether a further word block is to be processed or not. In the first case, the pointer registers and the word counter are loaded again and the data transfer will continue. In the latter case, a completely new measuring procedure may be started or the procedure is terminated.

The rate at which the interferogram is converted to digital words determines the highest frequency component that can be resolved by the following Fourier-analysis. For recognizing signal components of high frequency a very high scanning rate is desired. On the other hand, the scanning rate is limited by the time required for data processing and especially for data storage. One of the limiting factors is the duration necessary to transfer the data from the main memory to the disk storage and vice versa. Here, the operation speed of the disk storage is of great importance. The time interval allowed between successive data words assigned to any individual word block must be absolutely the same etime interval used in the following subsequent word blocks. Furthermore, the change from one data block to another must be performed in exactly this same time interval. For this reason, the time interval between two words must be chosen large enough to guarantee the transfer of a word block from the main memory to the disk storage and vice versa within the time necessary for accumulating another word block. A further condition is that between accumulating two words the central unit can fulfil the controlling tasks necessary during the transfer from one word block to the other. As far as the known devices are concerned, the central unit interrupts its actual activity for testing the operation status when the word counter sends the corresponding signal and transmits new data to the pointer register and the word counter. Depending on what tasks the central unit has to carry out, this interruption may require the processing of a long routine and the following activity might be interrupted by requirements of higher priority. Finally, the necessary tests and transfers of data require a large number of memory cycles, so that a considerable time may pass after the transfer of the last word of a word block until all measures are taken in order to transfer the first word of the following words block into the main memory.

As far as the above-mentioned known devices are concerned, the limiting factor is the disk storage, Here, it must be taken into account for reasons of cost that the devices of the type in question only will allow the use of relatively simple disk storage units. At the moment, however, economical disk storage devices are available having a considerably higher operation speed. The factor limiting the data acquisition is the time required by the central unit for controlling the transfer from one word block to the other. Attempts to reduce this time by a special time-saving programming turned out to be unsuccesful.

SUMMARY OF THE INVENTION

For this reason, the purpose of the invention lies in the construction of a device of the type described above in which the processing time required by the transition from one word block to the following word block is significantly reduced, in order to guarantee that the higher operating speed of the improved disk storage devices can be used efficiently for increasing the data accumulation rate.

The invention solves this problem by assigning in the data channel an address register to the pointer register and a block length register to the word counter and making an additional block counter available. The address and block length registers, as well as the block counter are loaded by the central unit at the beginning of a measuring procedure, whereas the pointer register and the word counter are loaded from the address and block length registers each time a word block is started, until the number of word blocks determined by the contents of the block counter has been accumulated.

The device, as constructed according to the invention, utilizes the additional registers and the block counter to avoid the activation of the central unit when changing from one word block to another. The data channel in its new form is able to control fully autonomously the transfer of data, forming exactly so many word blocks as specified by the central unit in the block counter at the beginning of a measuring procedure. The word counter determines the number of words belonging to one block and causes a change in the contents of the block counter at the end of each block. A change in the block counter can trigger a transfer of the contents of the block length register to the word counter as well as the contents of the address register to the pointer register. Here, it is possible that the pointer register may alternately receive two different starting addresses corresponding to the two word blocks to be created. A simpler method would be to assign in the main memory two successive storage areas for the two word blocks to allow the pointer register to count in an uninterrupted fashion through the memory addresses of two word blocks. Here, the transfer of the starting address from the address register would be necessary only after evey second word block. This can be executed very simply in a further development of the invention since the block counter, depending on the value of its lowest bit, will only affect a transfer of the contents of the address register to the pointer register after the end of every second word block.

In the design of the invention described until now, the total number of words stored is always the product of the length of a word block and the number of word blocks. If the total number of words has reached a value differing from such a product and if the end of the transfer of words is desired, a further development of the invention provides an additional total word counter for the data channel, which is loaded by the central unit at the beginning of the data acquisition and which then terminates the acquisition and transfer procedure after transferring the number of words determined by its contents.

As described above, the advantage of the device lies in enabling the transfer of rapidly incoming sequential data to a storage device as word blocks directly following each other without the intervention of the central unit during the change of one word block to the other. In principle, it is irrelevant from what source the data are delivered. Thus, the data channel design can be used also for the transfer of data between the main memory and the disk storage in both directions. The subject of the invention is a device as already described above, in which the data channel between main memory and disk storage is configured in the same way as described above for the data channel between the A/D converter and the main memory.

BRIEF DESCRIPTION OF THE DRAWINGS

The invention will now be described and explained in detail with reference to the illustrative embodiment shown in the drawings. The characteristics given in the description and in the drawings can be used individually or in any combination desired in other embodiments of the invention. In the drawings.

Figure 1:
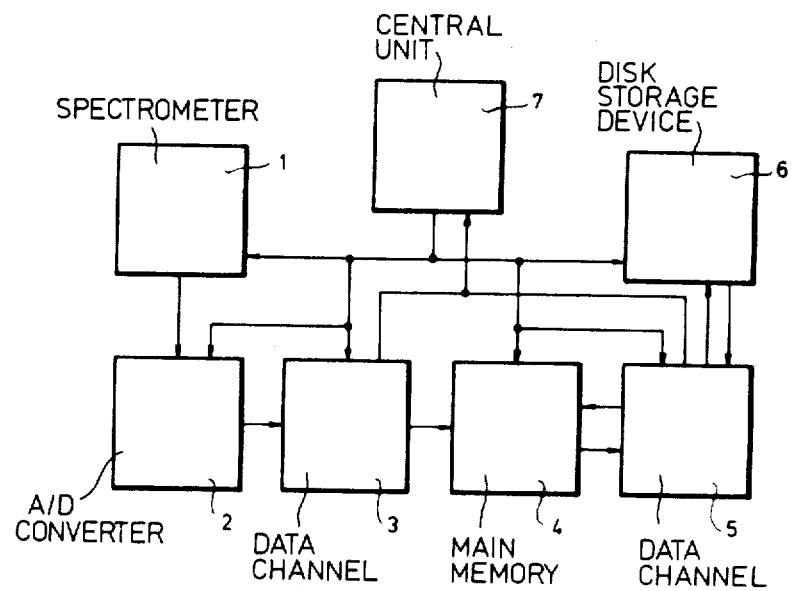
FIG. 1 is a schematic block diagram of a device for digital data accumulation, storage and processing.

The device described in FIG. 1 combines a spectrometer 1, in particular a Nuclear Magnetic Resonance Spectrometer which delivers a time-dependent electric analog signal which is to be acquired and stored in digital form. For this purpose an A/D converter 2 is connected to the spectrometer 1, which processes the analog signal delivered by spectrometer 1 in successive time intervals and delivers a digital word characteristic of the signal amplitude at each specified point in time. The words, which may comprise 6 to 16 bits, are delivered in time intervals of, for example, 8 $\mu$s and are transmitted by the A/D converter 2 to a main memory 4 via data channel 3. In main memory 4, a number of storage areas are reserved for the accumulation of words delivered by the A/D converter 2. Each of the words in this area may have a larger number of bits than the words delivered by the A/D converter 2 to enable the accumulation of data during a larger number of successive measuring procedures to improve the signal/noise ratio. Each word in main memory 4 might consist of 24 bits, for instance.

The total number of data words collected during a measurement can be so large that it will be impractical to utilize storage in the random access main memory 4 for this purpose. For this reason, a disk storage 6 to which data words can be transferred from main memory 4 is connected to main memory 4 via a further data channel 5. Thus, it is more practical to assign storage areas for two word blocks in main memory 4. Each block may comprise, for example, 4 K words (K = 1024) and the data transfer from main memory 4 to disk storage 6 is controlled in such a way as to allow the transfer of one word block from main memory 4 to disk storage 6 and the back-transfer to main memory of the next word block which was stored by the previous measurement. During this procedure, the current incoming data delivered to A/D converter 2 are being digitized and inserted into those storage locations of main memory 4 that are assigned to the other word block. Thus, the storage in memory of data words delivered by A/D converter 2 and the transfer of data between main memory and disk storage is performed concurrently, and there is an alteration of storage and transfer operations in the two areas of main memory assigned to the two word blocks. The starting of the measuring procedures and in part the data transfer are controlled by a central unit 7.

Figure 2:
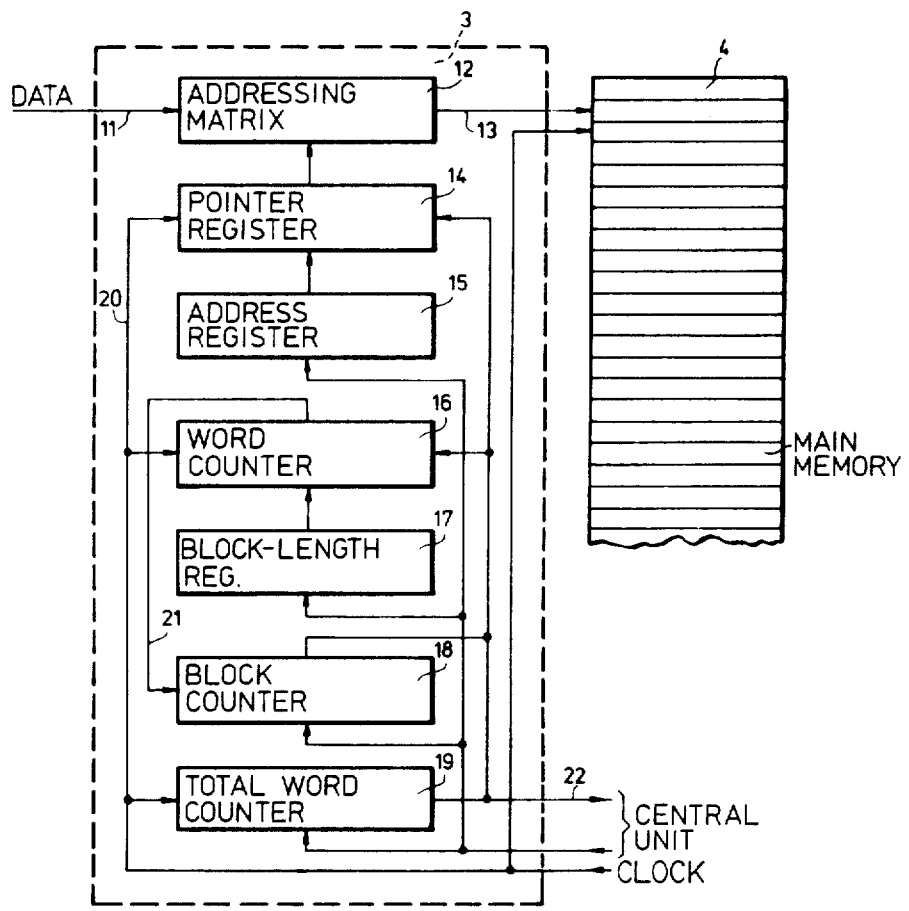
FIG. 2 is a schematic block diagram of the data channels contained in the device according to FIG. 1.

As shown in FIG. 2, the data channel 3 contains an addressing matrix 12, to which the data are transmitted on cable 11 by the A/D converter. This matrix transfers data to locations in main memory 4, whose addresses are contained in a pointer register 14 which is connected to the addressing matrix 12 and an addressing register 15.

Furthermore, data channel 3 contains a word counter 16 connected with a block length register 17, a block counter 18 and a total word counter 19. Before starting a measuring procedure, the central unit 7 loads into the address register 15 the starting address for the area in main memory 4 corresponding to the two word blocks used for data accumulation. The number of words forming a word block is loaded into the block length register. The number of word blocks necessary for the current data acquisition procedure is inserted into the block counter. The total number of data words created by the measurement is inserted into the total word counter 19. Simultaneously, the contents of the address register 15 and the block length register 17 are transferred to the pointer register 14 and the word counter 16, respectively.

When the measurement is started, the A/D converter 2 transfers data words at the pre-defined time intervals to the addressing matrix 12. As already mentioned, each data word is then stored in the main memory 4 location defined by pointer register 14. After ever transfer of a data word the address is changed in pointer register 14 according to the clock signal sent via cable 20; and, simultaneously, the word counter is decremented. This transfer of the data words to main memory 4 is controlled exclusively by data channel 3 without the intervention of the central unit 7.

When the word counter 16 has reached zero, which means that all the words belonging to a word block have been stored, the word counter 16 sends a signal to block counter 18 via cable 21, so that its contents are decremented by 1. Simultaneously, block counter 18 enables the transfer of the contents of block length register 17 back to word counter 16, i.e. word counter 16 is adjusted again to the total number of words of a word block. Furthermore, a signal is sent via cable 23 of central unit 7 to inform the central unit that a given word block is complete in memory and that the transfer of this word block to the disk storage can be started.

The transfer of the contents of the address register to the pointer register and of the block length register to the word counter is performed in a duration short compared to the time interval used for data accumulation and transfer to memory. This enables data accumulation and transfer to a second word block to occur without any interruption. After accumulating the first word block, the contents of the pointer register is not redefined from the address register so that the words assigned to the second word block are stored at addresses different from those addresses for the words of the first word block. The simplest method is to allow the storage area of the second word block to directly follow the storage areas of the first word block. When all the words of the second word block have been stored as described, word counter 16 will again reach zero, so the block counter is decremented by 1 again. The block counter initiates again a transfer of the contents of the block length register 7 to word counter 16 and now it also initiates the transfer of the address register 15 to the pointer register 14. To guarantee that the pointer register 14 is loaded with the fixed starting address only at the end of every second word block, the transfer command can be given to the pointer register 14 by block counter 18 only when the last bit of the block counter level has either the value "zero" or "one", as desired.

These procedures will continue until the block counter has reached zero, which means that all words of a measurement are accumulated and the measurement can be halted. In this case, the block counter sends a corresponding signal to the central unit via cable 22. Now, central unit 7 can check if a repetition of the measurement is necessary or if the procedure can be considered as finished.

It the total word number is not an integral multiple of the block length, the total word counter 19—whose contents are also decremented by one during the transfer of each word—reaches the value zero before block counter 18 reaches zero. In this case, the total word counter 19 instead of the block counter 18, sends a signal to central unit 7 indicating the end of the measurement.

It is obvious that in the example described the control of data word accumulation and transfer to the main memory is performed independently of the central unit, so that the duration required by these procedures is independent of the operation characteristics of the central unit. The rate of data acquisition is not bound by the limits necessary in other known devices, where after the storage of the words assigned to a given word block, the central unit must load the pointer register and the word counter with the starting value for each word block which follows. Thus, it is possible to operate with high data rates which are essentially limited by the speed of the data transfer from main memory 4 to disk storage 6.

As an example it is mentioned that a disk storage device having a bit rate of 10 MHz, e.g. the transfer of one bit takes 0.1 μs, is used in a device designed according to the invention. Important factors that influence the maximum data rate are the latency time of the disk storage and the necessity to transfer one word block from the main memory to disk storage and to transfer another word block from disk storage back into main memory during the period required for acquisition and storage of one word block in memory. When using 24-bit data words a data interval of 8 μs is possible, corresponding to a maximum detectable frequency of 62.5 KHZ. The A/D converter may deliver data words containing from 6 to 16 bits, and it is possible to add, for example, 1024 successive data words into a single memory location of 24 bits when the individual data words contain 14 bits.

As mentioned above, data channel 3 as described in very efficient due to its complete independence from the central unit, with the exception of the starting of the individual measurements, where the time between measurements can be as large as desired. The advantage of the independence of the central unit 7 is that it allows the central unit to execute other tasks, and this is especially important in the case of data channel 5 between main memory 4 and disk storage 6 which is designed to operate in a similar fashion. The disk storage 6 delivers data to main memory 4 at regular time intervals in a manner similar to that of the A/D converter 2. Furthermore, there are completely analogous conditions when data are to be transferred from main memory 4 to disk storage 6, so that data channel 5 can be constructed just in the same manner as data channel 3.

What we claim is:

1. A data processing device for digital acquisition, storage and processing of time-dependent data signals, especially for the accumulation of interferograms delivered by spin resonance and infrared spectrometers, said device comprising an A/D converter for receiving analog signals and converting said analog signals into digital signals including successive data words;

a main memory with random access and having a plurality of address locations for storing blocks of the data words;

a disk storage device affording additional storage for the blocks of the data words;

a first data channel for transmitting the data words between the A/D converter and the main memory;

said first data channel including a pointer register for receiving and registering a sequence of address locations and for directing the data words to said sequence of address locations in the main memory;

said pointer register being adapted to be advanced along said sequence upon receiving a first reloading signal;

said first data channel including a word counter for initially receiving a desired word count value as to the number of words to be included in each block and for counting the number of data words transmitted by said first data channel and for producing the first reloading signal upon reaching said word count value and for supplying said first reloading signal to said pointer register for advancing said pointer register along said sequence;

said fist data channel comprising an address register for receiving and storing the sequence of address locations and for initially loading and subsequently reloading the sequence of address locations into said pointer register and for receiving an address reloading signal for causing said reloading of the sequence of address locations;

said first data channel including a block length register for initially receiving and storing the desired word count value as to the number of data words to be included in each data block and for initially loading said word count value into said word counter and for receiving the first reloading signal from said word counter and for thereupon reloading said word counter with said word count value;

said first data channel including a block counter for initially receiving block count information as to the number of word blocks to be transmitted by said first data channel and for counting the word blocks as they are transmitted by said first data channel and for supplying an address reloading signal to said address register as each block is counted and for producing a terminating signal upon reaching a block count corresponding to said block count information;

a second data channel connected between said main memory and said disk storage device for transmitting data words therebetween;

and a central unit for controlling said second data channel and for initially receiving program information as to said desired word count value and as to said block count information and as to said sequence of address locations and for initially loading said sequence of address locations into said address register and for initially loading said desired word count value into said block length register and for initially loading said block count information into said block counter and for initially starting the operation of said first data channel and for receiving said terminating signal and for terminating the transmission of data words by said first data channel in response to said terminating signal.

2. A data processing device according to claim 1, said first data channel including a total word counter for initially receiving desired total word count information from the central unit as to the total number of words to be transmitted by said first data channel and for counting the words actually transmitted by said first data channel and for sending a second terminating signal to the central unit when the actual count reaches the desired total word count;

said central unit being constructed and arranged for receiving said second terminating signal and for terminating the transmission of data words by said first data channel in response to said second terminating signal.

3. A data processing device according to claim 1, in which said second data channel is constructed and arranged the same as said first data channel.

4. A data processing device for digital acquisition, storage and processing of time-dependent data signals, especially for the accumulation of interferograms delivered by spin resonance and infrared spectrometers, said device comprising an A/D converter for receiving analog signals and converting said analog signals into digital signals including successive data words;

a main memory with random access and having a plurality of address locations for storing blocks of the data words;

a disk storage device affording additional storage for the blocks of the data words;

a first data channel for transmitting the data words between the A/D converter and the main memory;

said first data channel including a pointer register for receiving and registering a sequence of address locations and for directing the data words to said sequence of address locations in the main memory;

said pointer register being adapted to be advanced along said sequence upon receiving a first reloading signal;

said first data channel including a word counter for initially receiving a desired word count value as to the number of words to be included in each block and for counting the number of data words transmitted by said first data channel and for producing the first reloading signal upon reaching said word count value and for supplying said first reloading signal to said pointer register for advancing said pointer register along said sequence;

said first data channel comprising an address register for receiving and storing the sequence of address locations and for initially loading and subsequently reloading the sequence of address locations into said pointer register and for receiving an address reloading signal for causing said reloading of the sequence of address locations;

said first data channel including a block length register for initially receiving and storing the desired word count value as to the number of data words to be included in each data block and for initially loading said word count value into said word counter and for receiving the first reloading signal from said word counter and for thereupon reloading said word counter with said word count value;

said first data channel including a block counter for initially receiving block count information as to the number of word blocks to be transmitted by said first data channel and for counting the word blocks as they are transmitted by said first data channel and for supplying an address reloading signal to said address register as every second block is counted and for producing a terminating signal upon reaching a block count corresponding to said block count information;

a second data channel connected between said main memory and said disk storage device for transmitting data words therebetween;

and a central unit for controlling said second data channel and for initially receiving program information as to said desired word count value and as to said block count information and as to said sequence of address locations and for initially loading said sequence of address locations into said address register and for initially loading said desired word count value into said block length register and for initially loading said block count information into said block counter and for initially starting the operation of said first data channel and for receiving said terminating signal and for terminating the transmission of data words by said first data channel in response to said terminating signal;

said sequence of address locations having an extent which is sufficient to accommodate two blocks of the data words.

* * * * *